United States Patent
Schwalke

[11] Patent Number: 6,037,196
[45] Date of Patent: Mar. 14, 2000

[54] PROCESS FOR PRODUCING AN INTEGRATED CIRCUIT DEVICE WITH AT LEAST ONE MOS TRANSISTOR

[75] Inventor: Udo Schwalke, Heldenstein, Germany

[73] Assignee: Siemens Aktiengesellschaft, Munich, Germany

[21] Appl. No.: 09/077,476
[22] PCT Filed: Nov. 7, 1996
[86] PCT No.: PCT/DE96/02121
 § 371 Date: May 29, 1998
 § 102(e) Date: May 29, 1998
[87] PCT Pub. No.: WO97/20336
 PCT Pub. Date: Jun. 5, 1997

[30] Foreign Application Priority Data

Nov. 30, 1995 [DE] Germany .......................... 195 44 721

[51] Int. Cl.[7] .................................................. H01L 21/28
[52] U.S. Cl. ........................... 438/151; 438/153; 438/301
[58] Field of Search ..................................... 438/151, 153, 438/301

[56] References Cited

U.S. PATENT DOCUMENTS 5,144,390 9/1992 Matloubian .
5,177,028 1/1993 Manning .
5,294,823 3/1994 Eklund et al. .

FOREIGN PATENT DOCUMENTS 0 115 131 A2 8/1984 European Pat. Off. .
0 373 893 A2 6/1990 European Pat. Off. .
0 442 296 A2 8/1991 European Pat. Off. .

OTHER PUBLICATIONS

IEEE (1994) Symposium on VLSI Technology Digest of Technical Papers, J M Hwang et al, Ultra–Thin Film SOI/CMOS with Selective–EPI Source/Drain for Low Series Resistance, High Drive Current, pp. 33–34.

IEEE (1995) Symposium on VLSI Technology Digest of Technical Papers, P V Gilbert et al, A Pelox Isolated Sub–0.5 Micron Thin–Film SOI Technology, pp. 37–38.

IEDM (1994) J Hyeok Choi et al, Extremely Thin Film (10nm) SOI MOSFET Characteristics Including Inversion Layer to Accumulation Layer Tunneling, pp. 645–648.

Kluwer Academic Publishers (1991), J P Colinge, Silicon–on–Insulator Technology: Materials to VLSI, pp. 94–98.

*Primary Examiner*—Chandra Chaudhari
*Assistant Examiner*—David S Blum
*Attorney, Agent, or Firm*—Hill & Simpson

[57] ABSTRACT

In order to produce an MOS transistor in an SOI substrate, the silicon layer (3), a gate dielectric (4) and an electrode layer (5) are structured in MESA fashion to form an active region. The flanks of the MESA structure (7) are provided with insulating spacers (8). In a further structuring step, a gate electrode (12) is formed from the electrode layer (5). The process provides a high packing density and at the same time avoids the problem of gate side-wall control as well as premature breakdown at oxide edges.

5 Claims, 5 Drawing Sheets

PROCESS FOR PRODUCING AN INTEGRATED CIRCUIT DEVICE WITH AT LEAST ONE MOS TRANSISTOR

BACKGROUND OF THE INVENTION

Various approaches are being adopted for developing integrated circuit arrangements with MOS transistors, which can be operated with operating voltages of less than 3 volts and which have reduced power consumption. One of these approaches proposes, instead of providing the conventionally used monocrystalline silicon wafer as a substrate, to provide an SOI substrate which comprises a monocrystalline silicon layer, an insulating layer arranged thereunder and a support wafer arranged under the latter.

MOS transistors are produced in the monocrystalline silicon layer of the SOI substrate. In this case, the active region of an MOS transistor is fully DC-insulated from adjacent components by etching away the surrounding silicon. This completely suppresses parasitic effects such as, for example, latch-up.

For the same operating speed, MOS circuits on an SOI substrate have a considerably lower power consumption than the corresponding circuit in a monocrystalline silicon wafer.

MESA etching of the monocrystalline silicon wafer has been proposed for lateral insulation of the active region of an MOS transistor in an SIO substrate (see, for example, Silicon-on-Insulator Technology, Jean Pierre Colinge, Kluwer Academic 1991, pages 94 to 98). In the vertical direction, the active region of the MOS transistor is insulated by the insulating layer arranged thereunder. In order to produce the MOS transistor, the surface of the MESA structure is provided with a gate oxide. A gate electrode, for example of polysilicon, is applied thereto. For contact with a gate line, the gate electrode extends partly over the side wall of the MESA. This requires gate side-wall control, which causes the undesirable, so-called "corner effect". This leads to non-ideal sub-threshold characteristics. Furthermore, oxide thinning occurs on the silicon edges of the MESA structure during the thermal oxidation for forming the gate dielectric. This can lead to premature oxide breakdown.

To avoid the side-wall effects, J. H. Choi et al., IEDM'94, page 645, has proposed the provision of a modified LOCOS insulation for lateral insulation of the active regions. In the LOCOS process, mechanical stresses are produced in the monocrystalline silicon layer. Furthermore, layer conformity is not guaranteed. Finally, it is difficult to scale the LOCOS process to structure sizes of less than 0.25 μm. The achievable packing density is thus limited.

Although P. V. Gilbert et al., VLSI'95, page 37, has proposed a modified LOCOS process for thin-film SOI technology, with which structure sizes of less than 0.5 μm can be achieved, the process is nevertheless expensive since it requires additional layer depositions and etching steps.

Furthermore, LOCOS processes lead to the formation of a so-called beak, which reduces the thickness of the monocrystalline silicon layer of the SOI substrate. At small layer thicknesses, as is recommendable for fast MOS transistors, this additionally leads to an increase in the impedance at the source/drain contact. J. M. Hwang et al., VLSI'94, page 33, has proposed to compensate such undesired yet unavoidable thinning of the silicon layer of the SOI substrate by selective growth of silicon.

SUMMARY OF THE INVENTION

The object of the invention is to provide a process for the production of an integrated circuit arrangement with at least one MOS transistor, with which a high packing density can be achieved for the MOS transistors, without this leading to gate side-wall control or oxide breakdown at the gate oxide edges.

In the process according to the invention, firstly a gate dielectric and a first electrode layer are applied to the monocrystalline silicon layer of an SOI substrate, and are structured together with the monocrystalline silicon layer of the SOI substrate. This produces a multi-layer structure, around which the surface of the insulating layer of the SOI substrate is exposed. Insulating spacers are formed on the flanks of the multi-layer structure. In a further structuring step, the first electrode layer is structured, in the multi-layer structure region, in such a way as to produce a gate electrode. On the one hand, the insulating spacers on the flanks of the multi-layer structure prevent gate side-wall control and, on the other hand, they prevent oxide thinning at the edges of the structured monocrystalline silicon layer, and thus premature oxide breakdown at the gate oxide edge. The gate dielectric is arranged only on the surface of the monocrystalline silicon layer, and not on its flanks.

After the insulating spacers have been formed on the flanks of the multi-layer structure, it is advantageous to apply a second electrode layer over the entire area. This second electrode layer is structured at the same time as the gate electrode is formed. At the same time as the second electrode layer is structured, it is possible to produce, protruding above the multi-layer structure, conductive connections for the gate electrode, for example a gate-line plane.

Further layers may be provided between the first electrode layer and the second electrode layer, for example for forming a floating gate. These further layers may be structured together with the first structuring for forming the multi-layer structure or with the second structuring for forming the gate electrode.

The source/drain regions of the MOS transistor are formed, laterally with respect to the gate electrode, in the monocrystalline silicon layer in the multi-layer structure region. Since, during the structuring of the gate electrode, the insulating spacer which has been formed on the flanks of the multi-layer structure is essentially not attacked, an indentation is produced between the spacer and the gate electrode. It is within the scope of the invention to provide the flanks of the gate electrode with insulating spacers and to fill the indentation by selective silicon epitaxy. The source/drain regions are then formed in the epitaxially grown silicon and the underlying monocrystalline silicon layer. This has the advantage that the MOS transistor has an essentially planar surface. When using an SOI substrate with a monocrystalline silicon layer with a thickness in the range of from 20 to 100 nm, as is advantageous for fast MOS transistors in view of the fully depleted channel region, this measure furthermore has the advantage that more silicon is available in the source/drain regions. This epitaxial filling of the indentation is advantageous, in particular in the formation of metal silicide on the surface of the source/drain regions, since silicon is consumed during the silicide formation, and this measure prevents the entire source/drain region from being consumed during the metal silicide formation.

It is within the scope of the invention, in the first structuring step, to form a large number of multi-layer structures for a large number of MOS transistors at the same time from the first electrode layer, the gate dielectric and the monocrystalline silicon layer.

If the gate electrodes of various MOS transistors are to be doped differently, the doping takes place after the multi-layer structures have been formed, for example by masked implantation. In this case, the doping of the gate electrodes can differ both with regard to the dopant concentration and with regard to the conductivity type. In particular in the production of complementary MOS transistors with $n^+$-doped and $p^+$-doped gate electrodes, the process can be used to advantage since doping after the formation of the multi-layer structures effectively suppresses lateral dopant diffusion between $n^+$-doped gate electrodes and $p^+$-doped gate electrodes.

A gate-line plane for connecting the various gate electrodes is, in this case, preferably produced during the structuring of the second electrode layer.

After the multi-layer structures have been formed, the intermediate spaces between adjacent multi-layer structures are filled with insulating material. This has the advantage that the second electrode layer is applied to a planarized surface.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

An SOI substrate comprises a support 1, an insulating layer 2 and a monocrystalline silicon layer 3. The support 1 consists, for example, of a monocrystalline silicon wafer. The insulating layer 2 consists, for example of $SiO_2$ and has a thickness of, for example, 400 nm. The monocrystalline silicon layer 3 is, for example, n-doped and has a thickness of, for example, 60 nm.

Figure 1:
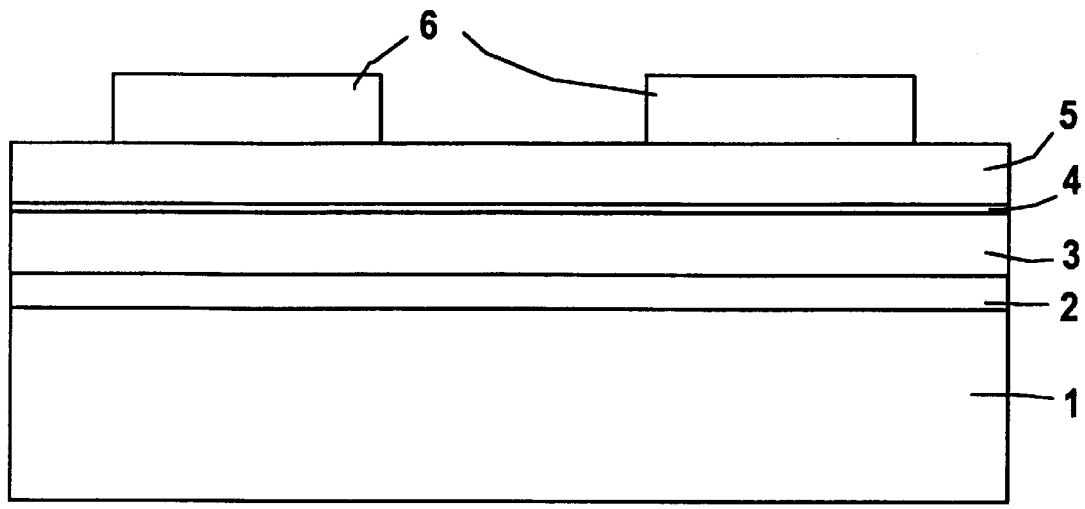
FIG. 1 shows an SOI substrate with a gate dielectric, a first electrode layer and a photoresist mask.

A gate dielectric 4 is applied to the monocrystalline silicon layer 3. The gate dielectric 4 is, for example, $SiO_2$ formed by thermal oxidation with a layer thickness of, for example, 6 nm (see FIG. 1).

A first electrode layer 5 is deposited on the gate dielectric 4. The first electrode layer 5 is, for example, amorphous or polycrystalline undoped or doped silicon, deposited to a layer thickness of 200 nm.

A photoresist mask 6, which defines the arrangement of active regions for MOS transistors in the monocrystalline silicon layer 3, is formed on the surface of the first electrode layer 5.

Figure 2:
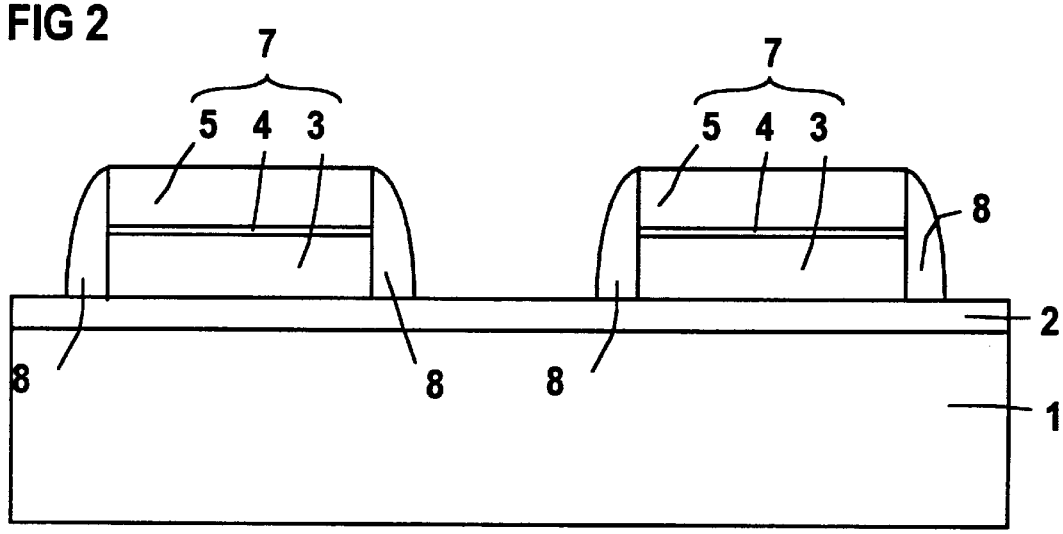
FIG. 2 shows the SOI substrate after formation of a multi-layer structure and formation of first insulating spacers on the flanks of the multi-layer structures.

By using a multi-stage, anisotropic etching process, for example with $CHF_3/O_2$ and $BCl_3/HCl$, the first electrode layer 5, the gate dielectric 4 and the monocrystalline silicon layer 3 are structured. This produces multi-layer structures 7, which each comprise the active region for one MOS transistor (see FIG. 2). By full-surface deposition of a dielectric layer with essentially conformal edge coverage, and by anisotropically etching back the dielectric layer, first insulating spacers 8 are formed on the flanks of the multi-layer structures. The first insulating spacers 8 are, for example, formed by $SiO_2$ or $Si_3N_4$.

Figure 3:
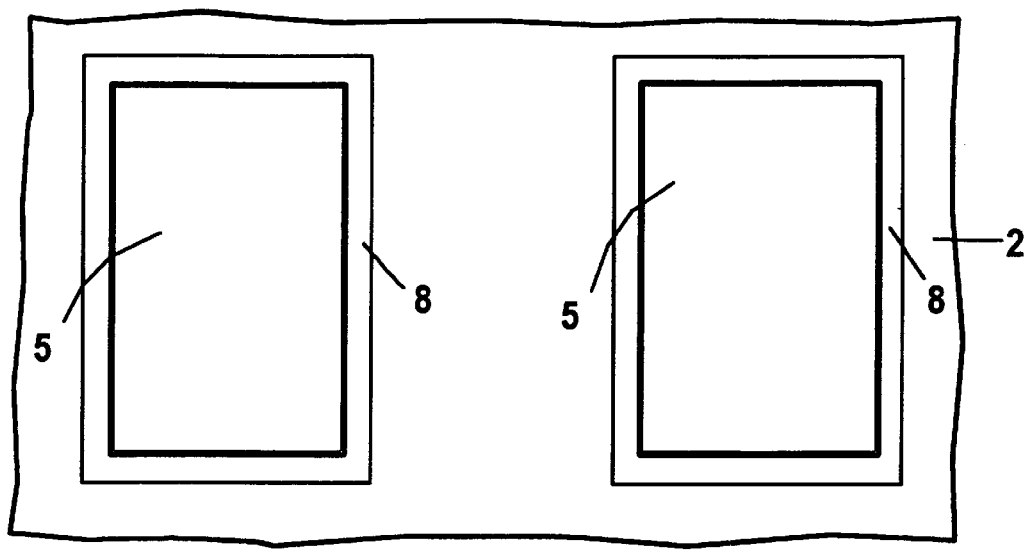
FIG. 3 shows a plan view of FIG. 2.

The first insulating spacers 8 in each case surround the multi-layer structure 7 in a ring (see plan view in FIG. 3). Each multi-layer structure 7 is insulated from the support 1 by the insulating layer 2, and from adjacent multi-layer structures 7 by the first insulating spacers 8. Outside the first insulating spacers 8, the surface of the insulating layer 2 is exposed.

After this, the structured first electrode layer 5 is doped, if it was deposited undoped. This is done, for example, by arsenic implantation ($5 \times 10^{15}$ cm$^{-2}$, 50 keV) or by vapour deposition.

Figure 4:
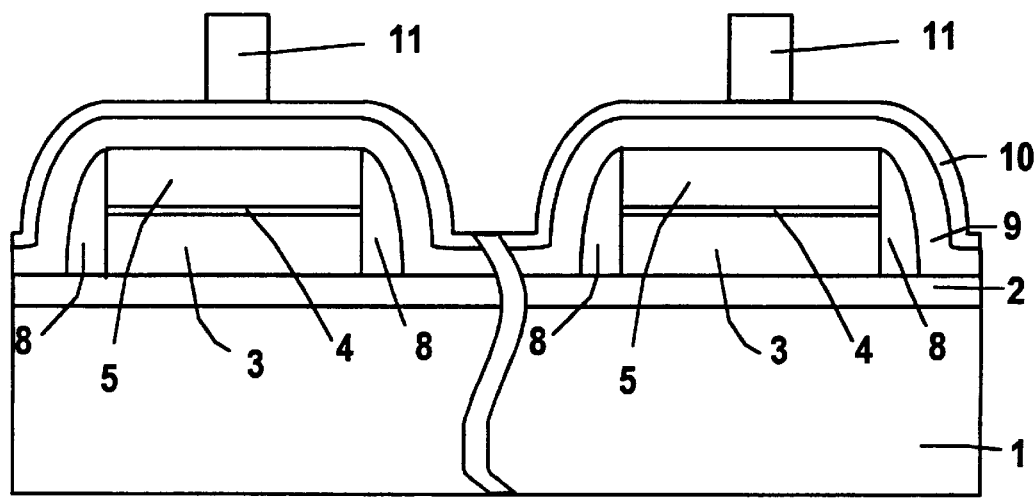
FIG. 4 shows a section through the SOI substrate after deposition of a second electrode layer, a cover layer and formation of a photoresist mask.

A second electrode layer 9 is deposited over the entire surface. The second electrode layer 9 is, for example, formed by doped, amorphous or polycrystalline silicon, metal silicide, metals such as, for example, TiN or W, or by combinations of these materials. It is deposited to a layer thickness of, for example, 50 to 200 nm (see FIG. 4).

A cover layer 10 is deposited on the second electrode layer, for example using TEOS. The cover layer 10 is formed to a thickness of, for example, 20 nm.

Figure 5:
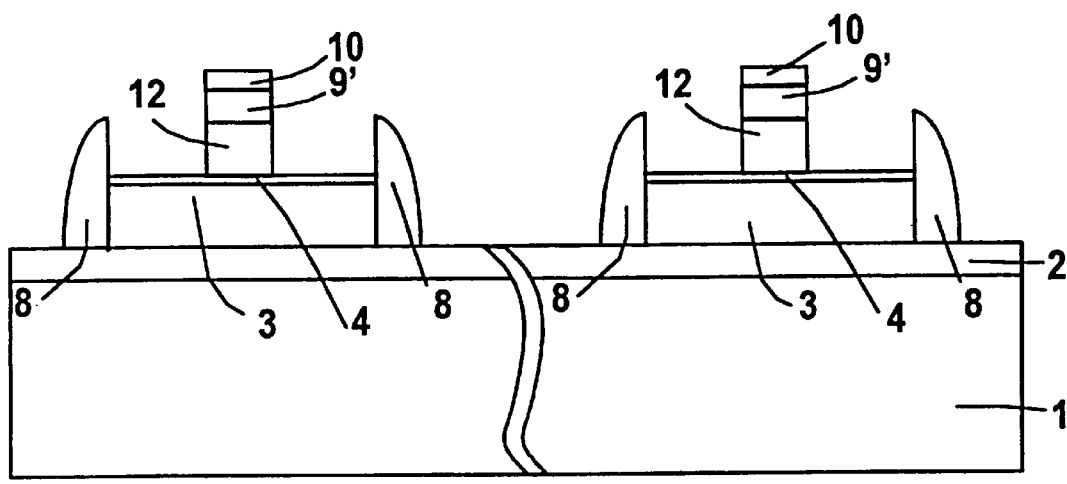
FIG. 5 shows the SOI substrate after the formation of gate electrodes.
Figure 6:
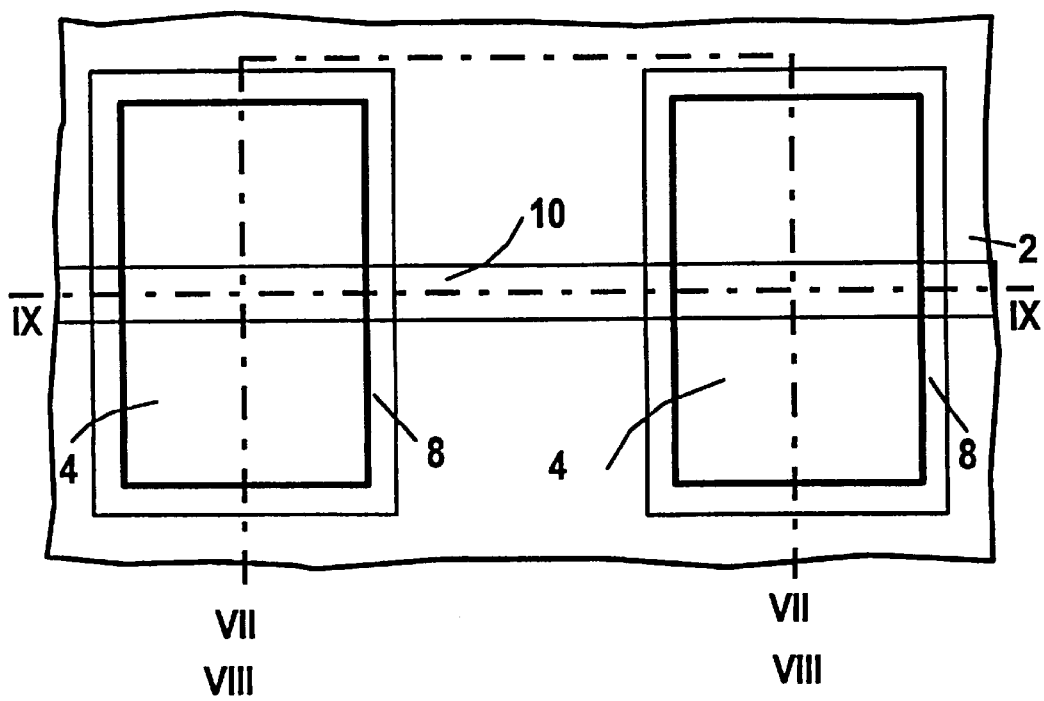
FIG. 6 shows a plan view of the structure in FIG. 5.

With the aid of a photoresist mask 11, the cover layer 10, the second electrode layer 9 and the structured first electrode layer 5 are structured (see FIG. 5). This is done by multi-stage anisotropic etching, for example with $CHF_3/O_2$ and $BCl_3/HCl$. In this case, gate electrodes 12 are formed from the first electrode layer 5. Gate lines 9', which connect the gate electrodes 12 to one another, are formed from the second electrode layer 9 (see plan view in FIG. 6). The gate lines 9' are connected with self-alignment to the gate electrodes 12 at the active regions.

Figure 7:
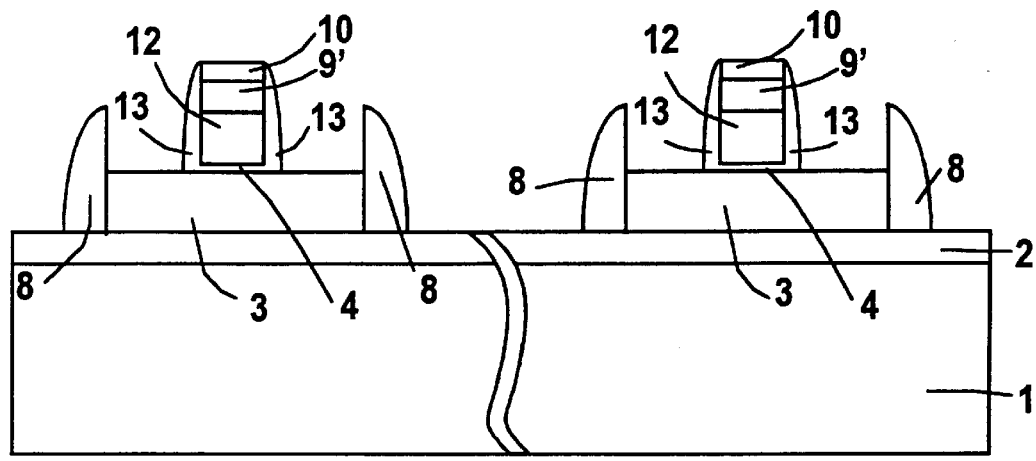
FIG. 7 shows a section, denoted VII—VII in FIG. 6, through the SOI substrate after the formation of second insulating spacers on the flanks of the gate electrodes.

Second insulating spacers 13 are formed on the flanks of the gate electrodes 12 and the cover layer 10 by conformally depositing and then anisotropically etching back TEOS-$SiO_2$ or $Si_3N_4$. During the spacer etching, the gate dielectric 4 is removed laterally with respect to the gate electrode 12, and the surface of the monocrystalline silicon layer 3 is exposed in the active regions (see FIG. 7).

Figure 8:
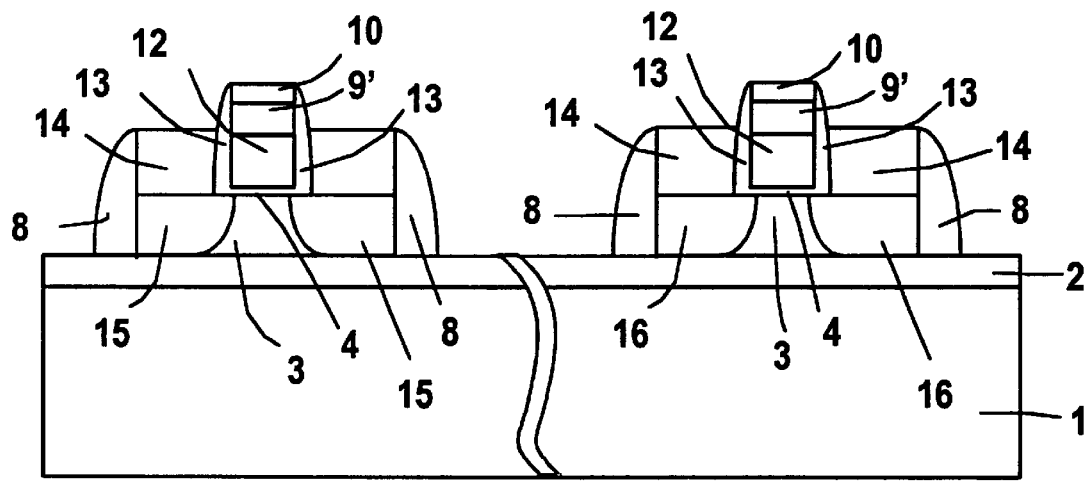
FIG. 8 shows a section, denoted VIII—VIII in FIG. 6, through the SOI substrate after deposition of silicon by selective epitaxy and after formation of source/drain regions.

A silicon region 14 is grown by selective epitaxy on the exposed surface of the monocrystalline silicon layer 3. The selective epitaxy takes place, for example, with $SiHCl_3$. The silicon region 14 is preferably grown to a thickness such that it ends level with the top of the first insulating spacers 8 (see FIG. 8).

$n^+$-doped source/drain regions 15 and $p^+$-doped source/drain regions 16 for NMOS transistors or PMOS transistors, respectively, are then produced in known fashion by ion implantation, a photographic technique (not represented in detail) and heat treatment. The source/drain regions 15, 16 each extend both in the silicon region 14 and in the underlying part of the monocrystalline silicon layer 3.

In order to complete the circuit arrangement, a passivation layer is then deposited, for example using BPSG, and planarized. Contact holes leading to the source/drain regions 15, 16 and to the gate electrodes 12 are etched and provided with metallizations. These process steps are not represented in detail.

Figure 9:
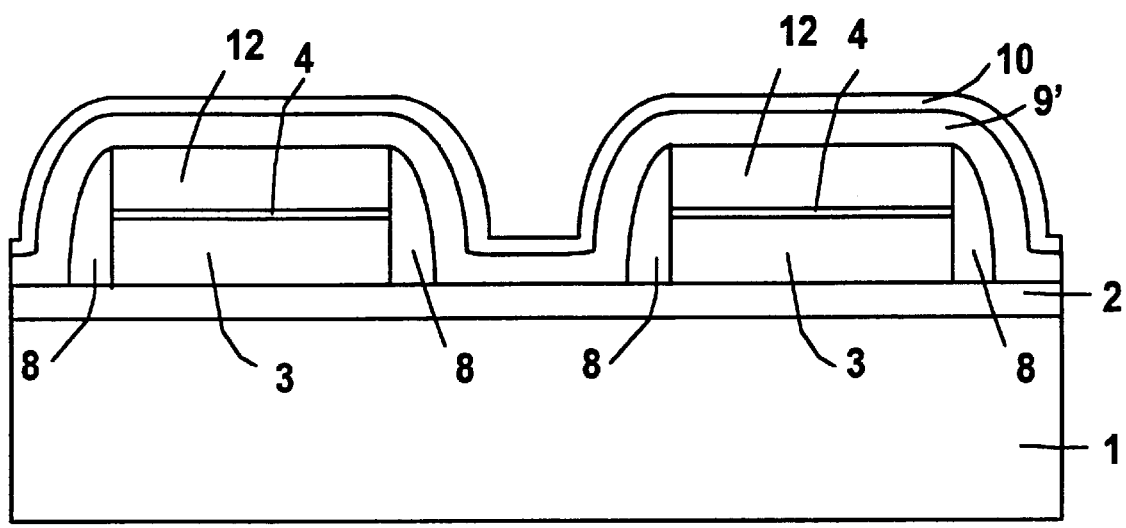
FIG. 9 shows the section denoted IX—IX in FIG. 6 through the SOI substrate.

Gate lines 9' are formed from the second electrode layer 9. The gate lines 9' extend over the first spacers 8 and the exposed surface of the insulating layer 2 outside the active regions for the MOS transistors. Since the surface of the monocrystalline silicon layer 3 is covered with the first insulating spacers 8, this prevents side-wall control of the MOS transistors by the second electrode layer 9. The first insulating spacers 8 on the flanks of the active transistor structures also effectively prevent thinning of the gate dielectric 4 at the edges of the active regions for the MOS transistors, which could lead to premature oxide breakdown (see FIG. 9).

As an alternative, it is possible to fill the intermediate space between adjacent multi-layer structures 7 with insulating material, after the first spacers 8 have been formed, by depositing and etching back an insulating layer, for example of $SiO_2$. During the etching-back, the surface of the first electrode layer 5 is exposed and the structure is planarized. The second electrode layer 9 is then deposited. In this case, the gate lines 9' extend over the surface of the insulating material used for filling.

The process according to the invention can be varied by providing additional electrode layers. These may either be layers above the second electrode layer which, for example, improve the conductivity of the second electrode layer or belong to a further connection plane, or may be layers between the first electrode layer and the second electrode layer, for example dielectric layers for forming a floating gate.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for producing an integrated circuit arrangement with at least one MOS transistor, comprising the steps of:

applying a gate dielectric to a surface of an SOI substrate which has at least one monocrystalline silicon layer and an insulating layer arranged thereunder;

applying a first electrode layer to the gate dielectric;

structuring the first electrode layer, the gate dielectric and the monocrystalline silicon layer using a first mask to produce multi-layer structures, each of which having an active region for the MOS transistor and around which the surface of the insulating layer is exposed;

forming first insulating spacers on flanks of the multi-layer structures;

applying a second electrode layer over an entire surface of at least the active region;

further structuring the structured first electrode layer and the second electrode layer using a second mask to produce gate electrodes from the first electrode layer and, in such a way as to produce a gate-line plane which connects together gate electrodes of at least two MOS transistors, from the second electrode layer;

forming source regions and drain regions in the active region.

2. The method according to claim 1, wherein second insulating spacers are formed on the flanks of the gate electrode before the source and drain regions are formed.

3. The method according to claim 2, wherein silicon regions are grown on an exposed surface of the silicon layer by selective epitaxy after the second insulating spacers have been formed.

4. The method according to claim 1, wherein the structured first electrode layer in the multi-layer structure for at least one MOS transistor is doped differently from a doping of the other MOS transistors after the multi-layer structures have been formed.

5. The method according to claim 1, wherein the first electrode layer comprises one of undoped amorphous silicon, doped amorphous silicon or polycrystalline silicon; and wherein the second electrode layer contains at least one of the substances: amorphous silicon, polycrystalline silicon, metal silicide or metal.

* * * * *